US012675192B2

(12) United States Patent
Jang et al.

(10) Patent No.: US 12,675,192 B2
(45) Date of Patent: Jul. 7, 2026

(54) TOUCH DISPLAY DEVICE AND DISPLAY PANEL WITH PSEUDO-TOUCH ELECTRODE AND TOUCH LINES HAVING DIFFERENT WIDTHS

(71) Applicant: LG Display Co., Ltd., Seoul (KR)

(72) Inventors: Jinyong Jang, Paju-si (KR); Sangug An, Paju-si (KR); Kyungsu Ha, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 18/899,524

(22) Filed: Sep. 27, 2024

(65) Prior Publication Data

US 2025/0165099 A1     May 22, 2025

(30) Foreign Application Priority Data

Nov. 20, 2023     (KR) ........................ 10-2023-0160156

(51) Int. Cl.
*G06F 3/041* (2006.01)
*G06F 3/044* (2006.01)
*H10K 59/40* (2023.01)

(52) U.S. Cl.
CPC .......... *G06F 3/0418* (2013.01); *G06F 3/0412* (2013.01); *G06F 3/04164* (2019.05); *G06F 3/04166* (2019.05); *G06F 3/0446* (2019.05); *H10K 59/40* (2023.02)

(58) Field of Classification Search
CPC ............. G06F 3/04164; G06F 3/04133; G06F 3/0412; G06F 3/0418; G06F 3/0446; H10K 59/40
See application file for complete search history.

(56) References Cited

U.S. PATENT DOCUMENTS

2023/0185400 A1* 6/2023 Park ...................... G06F 3/0445
345/173
2024/0393897 A1* 11/2024 Zeng ...................... G06F 3/041

* cited by examiner

*Primary Examiner* — Liliana Cerullo
(74) *Attorney, Agent, or Firm* — Fenwick & West LLP

(57) ABSTRACT

Embodiments of the disclosure relate to a touch display device and a display panel and, more specifically, to a touch display device, comprising a display panel including a plurality of touch electrode lines disposed in a display area and at least one pseudo-touch electrode line disposed in a non-display area and a touch circuit supplying a touch driving signal through a plurality of touch lines respectively connected to the plurality of touch electrode lines and supplying a pseudo-touch driving signal having a phase opposite to that of the touch driving signal through a pseudo-touch line connected to the at least one pseudo-touch electrode line, wherein at least some of the plurality of touch lines are formed to have different line widths according to positions of the plurality of touch electrode lines.

25 Claims, 14 Drawing Sheets

TOUCH DISPLAY DEVICE AND DISPLAY PANEL WITH PSEUDO-TOUCH ELECTRODE AND TOUCH LINES HAVING DIFFERENT WIDTHS

CROSS-REFERENCE TO RELATED APPLICATION

This application claims priority from Republic of Korea Patent Application No. 10-2023-0160156, filed on Nov. 20, 2023, which is hereby incorporated by reference in its entirety.

BACKGROUND

Field

Embodiments of the disclosure relate to a touch display device and, more specifically, to a touch display device and a display panel capable of effectively canceling out electromagnetic noise.

Description of Related Art

Representative display devices for displaying an image based on digital data include liquid crystal display (LCD) devices using liquid crystal and organic light emitting display devices using organic light emitting diodes OLEDs.

Among these display devices, the organic light emitting displays adopt light emitting diodes and thus has fast responsiveness and various merits in contrast ratio, luminous efficiency, brightness, and viewing angle. In this case, the light emitting diode may be implemented with an inorganic material or an organic material.

The organic light emitting diode display include light emitting diode in subpixels arranged on the display panel and enables the light emitting diodes to emit light by controlling the current flowing to the light emitting diodes, thereby controlling the brightness represented by each subpixel while displaying an image.

The display device recognizes the user's finger touch or a pen touch on the display panel and performs input processing based on the recognized touch so as to provide more various functions.

As an example, a touch display device capable of touch recognition may include a plurality of touch electrodes arranged or embedded in a display panel and detect the presence of the user's touch on the display panel and coordinates of a touch by driving the touch electrodes.

A touch display device may include signal lines for transferring various signals, and electromagnetic noise may be generated inside and outside the touch display device by signals applied to the signal lines.

As such, when electromagnetic noise occurs in the touch display device, malfunction may occur in touch sensing due to electromagnetic noise, and image quality may deteriorate.

Therefore, there is a need to reduce electromagnetic noise generated in the touch display device.

SUMMARY

Accordingly, the inventors of the disclosure have invented a touch display device and a display panel capable of effectively reducing defects due to electromagnetic noise.

Embodiments of the disclosure may provide a touch display device and a display panel capable of low-power operation while reducing defects due to electromagnetic noise by reducing a delay deviation between a touch driving signal and a pseudo-touch driving signal.

Embodiments of the disclosure may also provide a touch display device and a display panel capable of reducing defects due to electromagnetic noise and a delay deviation between a touch driving signal and a pseudo-touch driving signal by controlling the line width of a touch line formed in a non-display area of the display panel.

Embodiments of the disclosure may provide a touch display device, comprising a display panel including a plurality of touch electrode lines disposed in a display area and at least one pseudo-touch electrode line disposed in a non-display area and a touch circuit supplying a touch driving signal through a plurality of touch lines respectively connected to the plurality of touch electrode lines and supplying a pseudo-touch driving signal having a phase opposite to that of the touch driving signal through a pseudo-touch line connected to the at least one pseudo-touch electrode line, wherein at least some of the plurality of touch lines are formed to have different line widths according to positions of the plurality of touch electrode lines.

Further, embodiments of the disclosure may provide a touch display device, comprising a display panel including a plurality of touch electrode lines disposed in a display area and at least one pseudo-touch electrode line disposed in a non-display area and a touch circuit supplying a touch driving signal through a plurality of touch lines respectively connected to the plurality of touch electrode lines and supplying a pseudo-touch driving signal having a phase opposite to that of the touch driving signal through a pseudo-touch line connected to the at least one pseudo-touch electrode line, wherein the plurality of touch lines include a single touch line group formed of a single metal line and a dual touch line group formed of a dual metal line.

Embodiments of the disclosure may provide a display panel, comprising a plurality of touch electrode lines disposed in a display area, at least one pseudo-touch electrode line disposed in a non-display area, a plurality of touch lines connected to the plurality of touch electrode lines, respectively, to transfer a touch driving signal, and at least one pseudo-touch line connected to the at least one pseudo-touch electrode line to transfer a pseudo-touch driving signal having a phase opposite to that of the touch driving signal, wherein at least some of the plurality of touch lines are formed to have different line widths according to positions of the plurality of touch electrode lines.

According to embodiments of the disclosure, it is possible to effectively reduce defects due to electromagnetic noise.

According to embodiments of the disclosure, it is possible to enable low-power operation while reducing defects due to electromagnetic noise by reducing a delay deviation between a touch driving signal and a pseudo-touch driving signal.

According to embodiments of the disclosure, it is possible to reduce defects due to electromagnetic noise and a delay deviation between a touch driving signal and a pseudo-touch driving signal by controlling the line width of a touch line formed in a non-display area of the display panel.

BRIEF DESCRIPTION OF DRAWINGS

The above and other objects, features, and advantages of the disclosure will be more clearly understood from the following detailed description, taken in conjunction with the accompanying drawings, in which.

DETAILED DESCRIPTION

Figure 1:
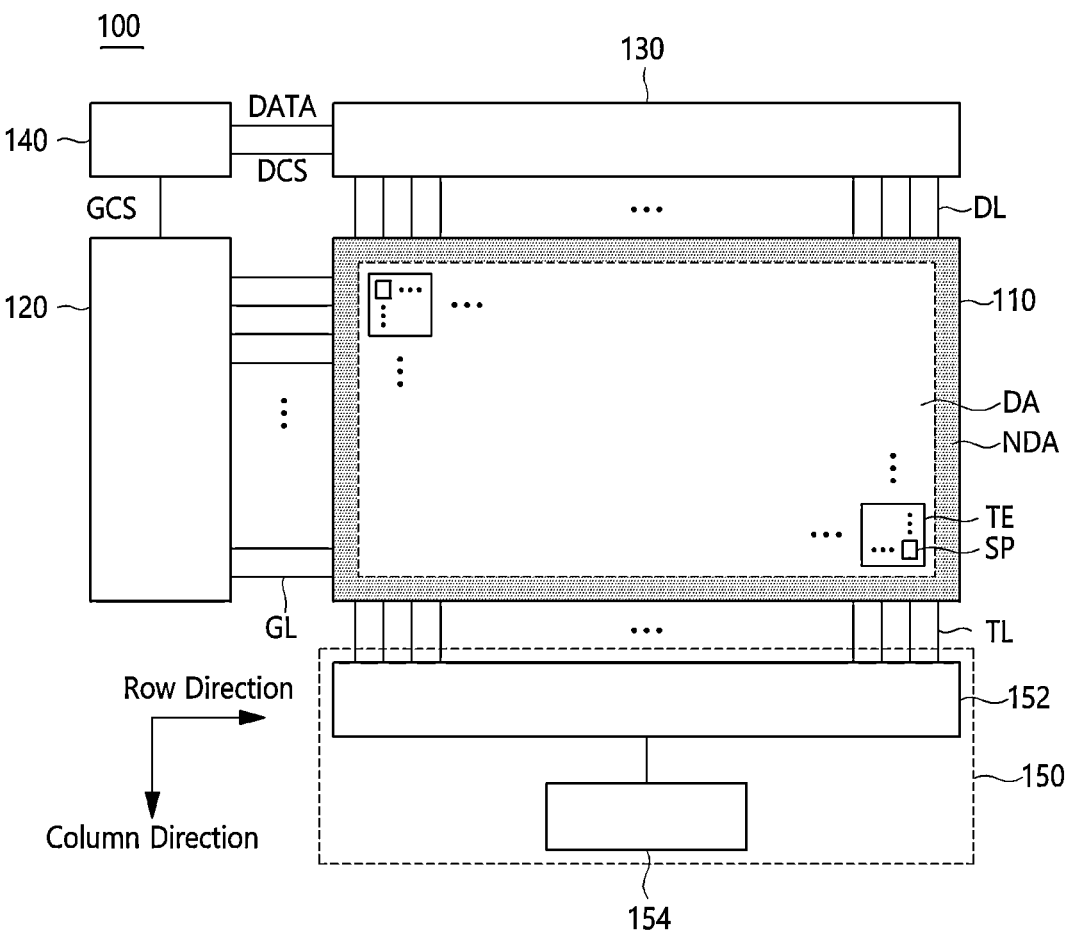
FIG. 1 is a view schematically illustrating a configuration of a touch display device according to embodiments of the disclosure.

Hereinafter, some embodiments of the disclosure will be described in detail with reference to exemplary drawings. In the following description of examples or embodiments of the disclosure, reference will be made to the accompanying drawings in which it is shown by way of illustration specific examples or embodiments that can be implemented, and in which the same reference numerals and signs can be used to designate the same or like components even when they are shown in different accompanying drawings from one another. Further, in the following description of examples or embodiments of the disclosure, detailed descriptions of well-known functions and components incorporated herein will be omitted when it is determined that the description may make the subject matter in some embodiments of the disclosure rather unclear. The terms such as "including", "having", "containing", "constituting" "make up of", and "formed of" used herein are generally intended to allow other components to be added unless the terms are used with the term "only". As used herein, singular forms are intended to include plural forms unless the context clearly indicates otherwise.

Terms, such as "first", "second", "A", "B", "(A)", or "(B)" may be used herein to describe elements of the disclosure. Each of these terms is not used to define essence, order, sequence, or number of elements etc., but is used merely to distinguish the corresponding element from other elements.

When it is mentioned that a first element "is connected or coupled to", "contacts or overlaps" etc. a second element, it should be interpreted that, not only can the first element "be directly connected or coupled to" or "directly contact or overlap" the second element, but a third element can also be "interposed" between the first and second elements, or the first and second elements can "be connected or coupled to", "contact or overlap", etc. each other via a fourth element. Here, the second element may be included in at least one of two or more elements that "are connected or coupled to", "contact or overlap", etc. each other.

When time relative terms, such as "after," "subsequent to," "next," "before," and the like, are used to describe processes or operations of elements or configurations, or flows or steps in operating, processing, manufacturing methods, these terms may be used to describe non-consecutive or non-sequential processes or operations unless the term "directly" or "immediately" is used together.

In addition, when any dimensions, relative sizes etc. are mentioned, it should be considered that numerical values for an elements or features, or corresponding information (e.g., level, range, etc.) include a tolerance or error range that may be caused by various factors (e.g., process factors, internal or external impact, noise, etc.) even when a relevant description is not specified. Further, the term "may" fully encompasses all the meanings of the term "can".

Hereinafter, various embodiments of the disclosure will be described in detail with reference to the accompanying drawings.

FIG. 1 is a view schematically illustrating a configuration of a touch display device according to an embodiment.

Referring to FIG. 1, a touch display device 100 according to embodiments of the disclosure may include a display panel 110, a data driving circuit 130, a gate driving circuit 120, and a timing controller 140 as components for displaying images.

The display panel 110 may include a display area DA in which images are displayed and a non-display area NDA in which no image is displayed.

The non-display area NDA may be an outer area of the display area DA and be referred to as a bezel area. The non-display area NDA may be an area visible from the front of the touch display device 100 or an area that is bent and not visible from the front of the touch display device 100.

The display panel 110 may include a plurality of subpixels SP. For example, the touch display device 100 may be various types of display devices including a liquid crystal display device, an organic light emitting display device, a micro light emitting diode (micro-LED) display device, and a quantum dot display device.

The structure of each of the plurality of subpixels SP may vary according to the type of the touch display device 100. For example, when the touch display device 100 is a self-emission display device in which the subpixels SP emit light by themselves, each subpixel SP may include a light emitting element that emits light by itself, one or more transistors, and one or more capacitors.

The display panel 110 may further include various types of signal lines to drive the plurality of subpixels SP. For example, various types of signal lines may include a plurality of data lines DL transferring data signals (also referred to as data voltages or image data) and a plurality of gate lines GL transferring gate signals (also referred to as scan signals).

The plurality of data lines DL and the plurality of gate lines GL may cross each other. Each of the plurality of data lines DL may be disposed while extending in a column direction. Each of the plurality of gate lines GL may be disposed while extending in a row direction.

Here, the column direction and the row direction are relative. For example, the column direction may be a vertical direction and the row direction may be a horizontal direction. As another example, the column direction may be a horizontal direction and the row direction may be a vertical direction.

The data driving circuit 130 is a circuit for driving the plurality of data lines DL, and may output data signals to the plurality of data lines DL. The gate driving circuit 120 is a circuit for driving the plurality of gate lines GL, and may supply gate signals to the plurality of gate lines GL.

The timing controller 140 is a device for controlling the data driving circuit 130 and the gate driving circuit 120 and may control driving timings for the plurality of data lines DL and driving timings for the plurality of gate lines GL.

The timing controller 140 may supply various types of data driving control signals DCS to the data driving circuit 130 to control the data driving circuit 130 and may supply various types of gate driving control signals GCS to the gate driving circuit 120 to control the gate driving circuit 120.

The data driving circuit 130 may supply data signals to the plurality of data lines DL according to the driving timing control by the timing controller 140. The data driving circuit 130 may receive digital image data DATA from the timing controller 140 and may convert the received image data DATA into analog data signals and output them to the plurality of data lines DL.

The gate driving circuit 120 may supply gate signals to the plurality of gate lines GL according to the timing control of the timing controller 140. The gate driving circuit 120 may receive a first gate voltage corresponding to a turn-on level voltage and a second gate voltage corresponding to a turn-off level voltage, along with various gate driving control signals GCS, generate gate signals, and supply the generated gate signals to the plurality of gate lines GL. The turn-on level voltage may be a high-level voltage, and the turn-off level voltage may be a low-level voltage. Conversely, the turn-on level voltage may be a low-level voltage, and the turn-off level voltage may be a high level voltage.

The gate driving circuit 120 may include one or more gate driving integrated circuits (GDICs). Depending on driving schemes, the gate driving circuit 120 may be positioned on only one side, or each of two opposite sides, of the display panel 110. The gate driving circuit 120 may be implemented in a gate-in-panel (GIP) type in which the gate driving circuit 120 is directly formed in the non-display area NDA of the display panel 110.

To provide a touch sensing function as well as an image display function, the touch display device 100 may include a touch screen panel and a touch circuit 150 that senses the touch screen panel to detect whether a touch occurs by a touch object, such as a finger or pen, or the position of the touch.

The touch circuit 150 may include a touch driving circuit 152 that drives and senses the touch screen panel and generates and outputs touch sensing data and a touch controller 154 that may detect an occurrence of a touch or the position of the touch using touch sensing data.

The touch screen panel may include a plurality of touch electrodes TE as touch sensors. The touch screen panel may further include a plurality of touch lines TL for electrically connecting the plurality of touch electrodes TE and the touch driving circuit 152. The touch screen panel or touch electrode TE is also referred to as a touch sensor.

The touch screen panel may exist outside or inside the display panel 110. When the touch screen panel exists outside the display panel 110, the touch screen panel is referred to as an external-type touch screen panel. When the touch screen panel is of the external type, the touch screen panel and the display panel 110 may be separately manufactured or may be combined. The external-type touch screen panel may include a substrate and a plurality of touch electrodes TE on the substrate.

When the touch screen panel exists inside the display panel 110, the touch screen panel is referred to as an internal-type touch screen panel. In the internal-type touch screen panel, the touch screen panel may be formed in the display panel 110 during a manufacturing process of the display panel 110.

The touch driving circuit 152 may supply a touch driving signal to at least one of the plurality of touch electrodes TE and detect a touch sensing signal transferred from at least one touch electrode TE among the plurality of touch electrodes TE, generating touch sensing data.

The touch circuit 150 may perform touch sensing in a self-capacitance sensing scheme or a mutual-capacitance sensing scheme.

When the touch circuit 150 performs touch sensing in the self-capacitance sensing scheme, the touch circuit 150 may perform touch sensing based on capacitance between each touch electrode TE and the touch object (e.g., finger or pen).

When the touch circuit 150 performs touch sensing in the mutual-capacitance sensing scheme, the touch circuit 150 may perform touch sensing based on capacitance between the touch electrodes TE.

According to the mutual-capacitance sensing scheme, the plurality of touch electrodes TE are divided into driving touch electrodes and sensing touch electrodes. The touch driving circuit 152 may drive the driving touch electrode by the touch driving signal and may detect the touch sensing signal from the sensing touch electrode.

According to the self-capacitance sensing scheme, each of the plurality of touch electrodes TE may serve both as a driving touch electrode and as a sensing touch electrode. The touch driving circuit 152 may drive all or some of the plurality of touch electrodes TE and sense all or some of the plurality of touch electrodes TE.

The touch driving circuit 152 and the touch controller 154 may be implemented as separate devices or as a single device.

Alternatively, the touch driving circuit 152 and the data driving circuit 130 may be implemented as separate integrated circuits. Alternatively, the whole or part of the touch driving circuit 152 and the whole or part of the data driving circuit 130 may be integrated into a single integrated circuit.

The touch display device 100 according to embodiments of the disclosure may be a self-emissive display device having self-emissive light emitting elements disposed on the display panel 110, such as an organic light emitting display device, a quantum dot display device, a micro-LED display device, and the like.

Figure 2:
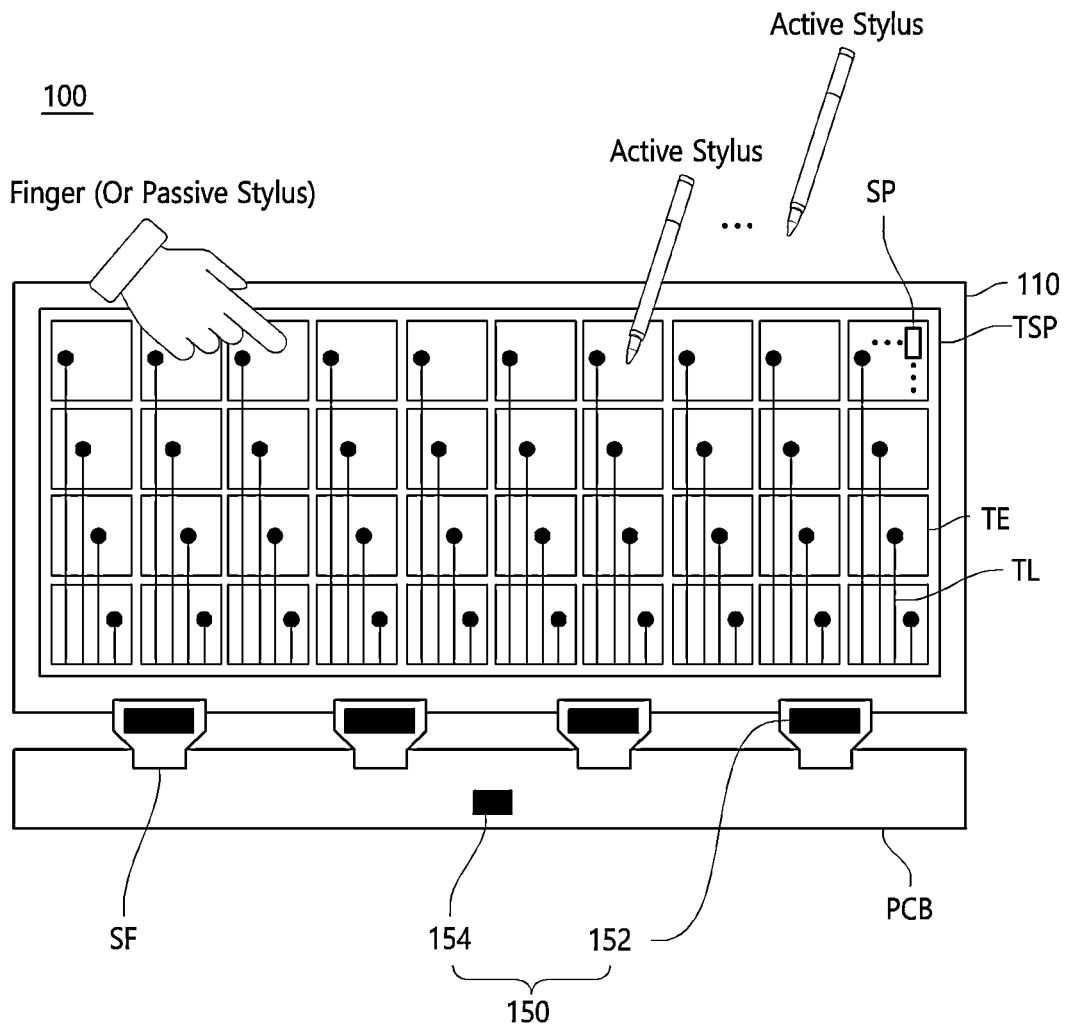
FIG. 2 is a view illustrating an example touch sensing system of a touch display device according to embodiments of the disclosure.

FIG. 2 is a view illustrating an example touch sensing system of a touch display device according to embodiments of the disclosure.

Referring to FIG. 2, a touch display device 100 according to embodiments of the disclosure is a display device that may provide not only an image display function, but also a touch sensing function for a passive stylus, such as a finger, and a touch sensing function (stylus recognition function) for an active stylus, such as a pen.

A touch display device 100 according to embodiments of the disclosure is a display device in which a touchscreen panel TSP including a plurality of touch electrodes TE as touch sensors is built into a display panel 110, and may be a television (TV), a monitor, or a mobile device, such as a tablet, a smartphone, etc.

For example, the touch display device 100 may divide the common electrode used in the display period into a plurality of blocks and use them as touch electrodes TE.

As another example, the touch display device 100 may use a plurality of touch electrodes TE composed of touch sensing electrodes and touch driving electrodes.

The display panel 110 may be a variety of types of panels, such as a liquid crystal display panel or an organic light-emitting display panel.

For example, when the display panel 110 is a liquid crystal display panel, the touch display device 100 may divide the common electrode, which receives a common voltage to form an electric field with the pixel electrode, into a plurality of blocks and use them as a plurality of touch electrodes TE.

As another example, when the display panel 110 is an organic light emitting diode panel, the touch display device 100 may include a first electrode, an organic light emitting layer, and a second electrode, which constitute an organic light emitting diode, an encapsulation layer positioned thereon to provide an encapsulation function, and a touch sensor metal layer positioned thereon. A plurality of touch electrodes TE may be formed on the touch sensor metal layer.

In the following description, it is assumed that a plurality of touch electrodes TE are used as touch sensors in a touch driving process, and are used as a common electrode in a display driving process for convenience of description.

The touch display device 100 may include a touch circuit 150 that performs touch sensing and stylus sensing according to the signal received through the display panel 110 by driving the display panel 110 having a built-in touchscreen panel TSP.

The touch circuit 150 may include a first circuit for driving the display panel 110 to receive a signal through the display panel 110 and a second circuit for performing passive touch sensing (finger touch sensing) and active touch sensing using the signal received through the display panel 110.

The first circuit is referred to as a touch driving circuit 152, and the second circuit is referred to as a touch controller 154.

The touch driving circuit 152, together with the data driving circuit 130 for driving the data lines, may be implemented as an integrated driving circuit.

The touch driving circuit 152 may be of a chip on film (COF) type in which it is mounted on a source film SF.

The source film SF on which the touch driving circuit 152 is mounted may be coupled to each of the bonding unit of the display panel 110 and the bonding unit of the printed circuit board (PCB).

The touch controller may be mounted on the printed circuit board (PCB).

The touch driving circuit 152 and the data driving circuit 130 may be integrated in separate integrated driving circuits.

The touch driving circuit 152 may be electrically connected to a plurality of touch electrodes TE constituting the display panel 110 through a plurality of touch lines.

In this case, the touch driving circuit 152 may perform touch sensing in a time-divided touch driving period separately from the display period. The touch period for performing touch sensing may proceed simultaneously with the display driving period.

Figure 3:
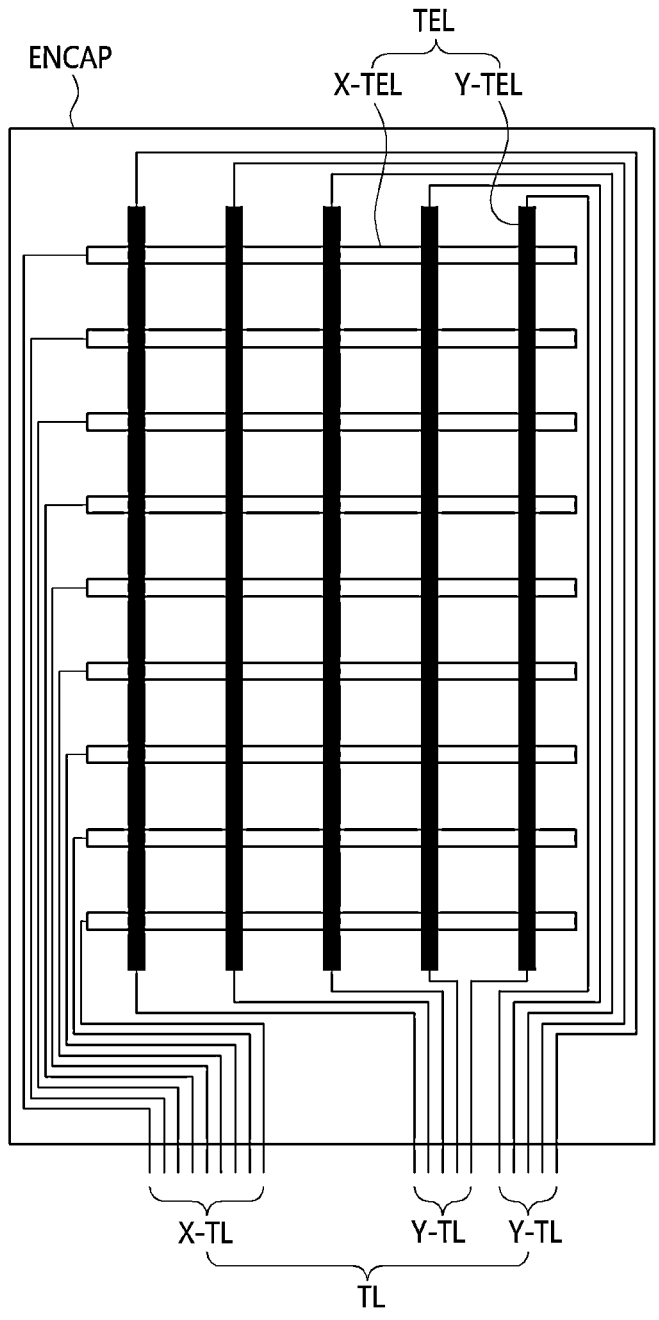
FIG. 3 is a view schematically illustrating a touch electrode structure for mutual capacitance-based touch sensing in a touch display device according to embodiments of the disclosure.

FIG. 3 is a view schematically illustrating a touch electrode structure for mutual capacitance-based touch sensing in a touch display device according to embodiments of the disclosure.

Referring to FIG. 3, a touch electrode structure for mutual capacitance-based touch sensing in the touch display device 100 according to embodiments of the disclosure may include a plurality of X-touch electrode lines X-TEL and a plurality of Y-touch electrode lines Y-TEL. The plurality of X-touch electrode lines X-TEL and the plurality of Y-touch electrode lines Y-TEL may be positioned on an encapsulation layer ENCAP.

The plurality of X-touch electrode lines X-TEL each may be disposed in a first direction, and the plurality of Y-touch electrode lines Y-TEL each may be disposed in a second direction different from the first direction.

In the disclosure, the first direction and the second direction may be relatively different directions. As an example, the first direction may be the x-axis direction, and the second direction may be the y-axis direction. In contrast, the first direction may be the y-axis direction, and the second direction may be the x-axis direction. The first direction and the second direction may be, or may not be, perpendicular to each other. In the disclosure, row and column are relative terms, and from a point of view, the terms "row" and "column" may be interchangeably used.

Each of the X-touch electrode lines X-TEL may be constituted of a plurality of X-touch electrodes electrically connected with each other. Each of the Y-touch electrode lines Y-TEL may be constituted of a plurality of Y-touch electrodes electrically connected with each other.

The plurality of X-touch electrodes and the plurality of Y-touch electrodes are included in the plurality of touch electrodes TE and whose roles (functions) are distinguished.

For example, the plurality of X-touch electrodes respectively constituting the plurality of X-touch electrode lines X-TEL may be driving touch electrodes, and the plurality of Y-touch electrodes respectively constituting the plurality of Y-touch electrode lines Y-TEL may be sensing touch electrodes. In this case, each of the plurality of X-touch electrode lines X-TEL corresponds to the driving touch electrode line, and each of the plurality of Y-touch electrode lines Y-TEL corresponds to the sensing touch electrode line.

Conversely, the plurality of X-touch electrodes respectively constituting the plurality of X-touch electrode lines X-TEL may be sensing touch electrodes, and the plurality of Y-touch electrodes respectively constituting the plurality of Y-touch electrode lines Y-TEL may be driving touch electrodes. In this case, each of the plurality of X-touch electrode lines X-TEL corresponds to the sensing touch electrode line, and each of the plurality of Y-touch electrode lines Y-TEL corresponds to the driving touch electrode line.

A touch sensor metal for touch sensing may include a plurality of touch lines TL as well as the plurality of X-touch electrode lines X-TEL and the plurality of Y-touch electrode lines Y-TEL.

The plurality of touch lines TL may include a plurality of X-touch lines X-TL respectively connected to the plurality of X-touch electrode lines X-TEL and a plurality of Y-touch lines Y-TL respectively connected to the plurality of Y-touch electrode lines Y-TEL.

Figure 4:
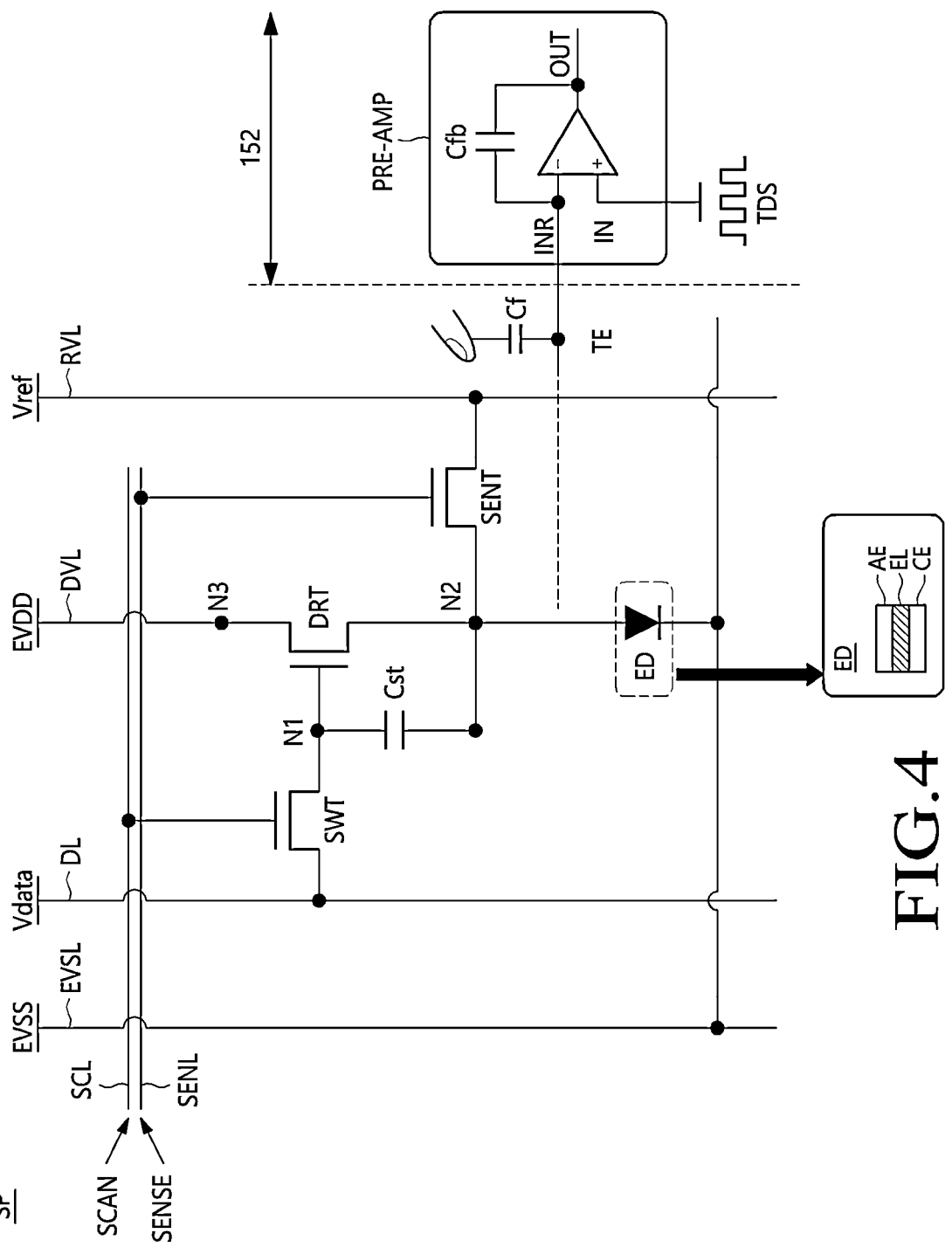
FIG. 4 is a view illustrating an example equivalent circuit of a subpixel constituting a display panel in a touch display device according to embodiments of the disclosure.

FIG. 4 is a view illustrating an example equivalent circuit of a subpixel constituting a display panel in a touch display device according to embodiments of the disclosure.

Referring to FIG. 4, in the touch display apparatus 100 according to embodiments of the disclosure, each of the plurality of subpixels SP may include a light emitting element ED, a driving transistor DRT for driving the light emitting element ED, a switching transistor SWT for switching an electrical connection between the gate electrode of the driving transistor DRT and a data line DL, and a storage capacitor Cst electrically connected between the gate electrode of the driving transistor DRT and the source electrode or drain electrode of the driving transistor DRT.

The gate electrode of the driving transistor DRT corresponds to the first node N1. The source electrode or drain electrode of the driving transistor DRT corresponds to the second node N2. The drain electrode or source electrode of the driving transistor DRT corresponds to the third node N3.

The light emitting element ED may include an anode electrode AE, a light emitting layer EL, and a cathode electrode CE. The light emitting layer EL may be positioned on the cathode electrode CE, and the anode electrode AE may be positioned on the light emitting layer EL. For example, the light emitting element ED is a device for a self-luminous display, and may include an organic light emitting diode (OLED), a light emitting element formed of a quantum dot, or a micro light emitting diode (micro LED).

The anode electrode AE may be referred to as a pixel electrode, and the cathode electrode CE may be referred to as a common electrode.

The drain electrode or source electrode of the switching transistor SWT may be electrically connected to the data line DL. The source electrode or drain electrode of the switching transistor SWT may be electrically connected to the gate electrode of the driving transistor DRT at the first node N1. The gate electrode of the switching transistor SWT may be electrically connected to the scan signal line SCL, which is a type of gate line GL. The on/off of the switching transistor SWT may be controlled by the scan signal SCAN supplied from the scan signal line SCL.

The storage capacitor Cst may be electrically connected between the first node N1 and the second node N2. The storage capacitor Cst may serve to maintain a voltage difference between the first node N1 and the second node N2 for a predetermined period of time (e.g., one frame time). The storage capacitor Cst is not an internal capacitor (parasitic capacitor) of the driving transistor DRT, but an external capacitor intentionally designed to drive the subpixel SP.

It has been described above that each subpixel SP includes a light emitting element ED, two transistors DRT and SWT, and one capacitor Cst, but each subpixel SP may further include one or more transistors and, in some cases, may further include one or more capacitors.

For example, as illustrated in FIG. 3, each subpixel SP may further include a sensing transistor SENT for controlling the connection between the second node N2 and the reference voltage line RVL.

The drain electrode or source electrode of the sensing transistor SENT may be electrically connected to the reference voltage line RVL. The source electrode or drain electrode of the sensing transistor SENT may be electrically connected to the source electrode or drain electrode of the driving transistor DRT at the second node N2 and may also be electrically connected to the anode electrode AE. The gate electrode of the sensing transistor SENT may be electrically connected to the sense signal line SENL, which is a type of gate line GL. The on/off of the sensing transistor SENT may be controlled by the sense signal SENSE supplied from the sense signal line SENL.

The anode electrode AE may be disposed in each of a plurality of subpixels SP, and may be electrically connected to the source electrode or drain electrode of the driving transistor DRT. In other words, at the second node N2, the anode electrode AE may be electrically connected to the source electrode or drain electrode of the driving transistor DRT.

The third node N3 may be electrically connected to the driving voltage line DVL to which a high-level driving voltage EVDD is applied and may be corresponding to the drain electrode or source electrode of the driving transistor DRT.

In this case, during a display driving period, a high-level driving voltage EVDD necessary for displaying an image may be supplied to the driving voltage line DVL. For example, the high-level driving voltage EVDD necessary for displaying an image may be 27V.

The driving transistor DRT is turned on by a voltage difference between the first node N1 and the third node N3, supplying a driving current to the light emitting element ED.

The cathode electrode CE may be commonly disposed in a plurality of subpixels SP. A direct current (DC)-level base voltage EVSS having no voltage level change may be applied to the cathode electrode CE. Here, the base voltage EVSS may correspond to a common voltage commonly applied to light emitting elements ED of all the subpixels SP.

In the touch display device 100 according to embodiments of the disclosure, the display panel 110 may further include a plurality of base voltage lines EVSL electrically connected to the cathode electrode CE.

When the plurality of base voltage lines EVSL are used, the base voltage EVSS may be uniformly applied to the entire area of the cathode electrode CE. The method of supplying the base voltage EVSS using the plurality of base voltage lines EVSL may have an effect of efficiently supplying the base voltage EVSS when a large-area cathode electrode CE is provided due to the large-area display panel 110.

The touch driving circuit 152 may include one or more pre-amplifiers PRE-AMP. The pre-amplifier PRE-AMP may include a non-inverting input terminal IN to which the touch driving signal TDS is input, an inverting input terminal INR electrically connected to the touch electrode TE, an output terminal OUT to output an output signal, and a feedback capacitor Cfb connected between the non-inverting input terminal IN and the output terminal OUT.

In the touch display device 100 according to embodiments of the disclosure, as a partial area of the touch electrode TE is formed to overlap a partial area of the anode electrode AE above or under the anode electrode AE, the area of the touch electrode TE may be increased, and touch performance may be enhanced.

Accordingly, the inverting input terminal INR of the pre-amplifier PRE-AMP may be electrically connected to the touch electrode TE formed at a position where a partial area thereof overlaps the anode electrode AE of the light emitting element ED.

The touch driving signal TDS applied to the non-inverting input terminal IN of the pre-amplifier PRE-AMP may be a signal whose voltage level is varied and may have a predetermined frequency and amplitude.

When the user touches the screen with a finger or pen, a capacitance Cf may be formed between the touch electrode TE and the finger or pen. The capacitance Cf is called a finger capacitance Cf.

The touch display device 100 may be used for a mobile device such as a smartphone or a tablet PC and a display for a vehicle, and in this case, an antenna may be used for the touch display device 100 to communicate with another device.

In this case, in the touch display device 100 using an antenna, the transmission/reception performance and the touch sensing performance of the wireless signal may be deteriorated due to electromagnetic interference with the touch driving signal transferred through the touch electrode line TEL in the process of transferring/receiving the wireless signal in a high frequency band.

To address this problem, the touch display device 100 according to the disclosure may arrange a pseudo-touch electrode line capable of canceling out electromagnetic noise caused by a wireless signal or the like in the non-display area NDA.

Figure 5:
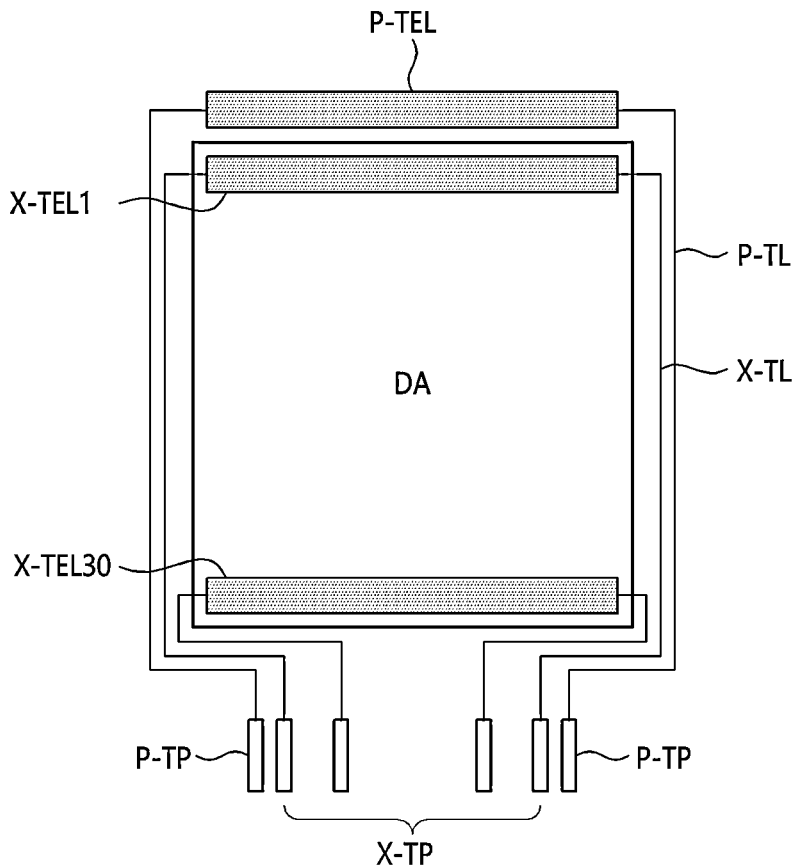
FIG. 5 is a view illustrating an example structure in which a pseudo-touch electrode line is disposed in a touch display device according to embodiments of the disclosure.

FIG. 5 is a view illustrating an example structure in which a pseudo-touch electrode line is disposed in a touch display device according to embodiments of the disclosure.

Referring to FIG. 5, the touch display device 100 according to embodiments of the disclosure may include a plurality of X-touch electrode lines X-TEL and a plurality of Y-touch electrode lines Y-TEL disposed in the display area DA of the display panel 110, and a pseudo-touch electrode line P-TEL disposed in the non-display area NDA.

Here, for convenience of description, an example in which a touch driving signal is applied through 30 X-touch electrode lines X-TEL1 to X-TEL30 disposed in the first direction in the display area DA, and a pseudo-touch driving signal is applied through the pseudo-touch electrode line P-TEL in a direction parallel to the X-touch electrode line X-TEL in the non-display area is illustrated. In this case, the first X-touch electrode line X-TEL1 may be disposed at the farthest position from the touch circuit 150, and the 30th X-touch electrode line X-TEL30 may be disposed at the closest position from the touch circuit 150.

Each of the 30 X-touch electrode lines X-TEL1 to X-TEL30 is electrically connected to the corresponding X-touch pad X-TP through one X-touch line X-TL. For example, the first X-touch line may be connected to the first X-touch electrode line X-TEL1, and the 30th X-touch line may be connected to the 30th X-touch electrode line X-TEL30. In this case, the X-touch electrode disposed at the outermost portion among the plurality of X-touch electrodes included in one X-touch electrode line X-TEL may be electrically connected to the corresponding X-touch pad X-TP through the X-touch line X-TL.

One or more pseudo-touch electrode lines P-TEL disposed in the non-display area may be disposed in parallel with the X-touch electrode lines X-TEL1 to X-TEL30 to which the touch driving signal is supplied. In this case, one pseudo-touch electrode line P-TEL is electrically connected to a corresponding pseudo-touch pad P-TP through one pseudo-touch line P-TL. In this case, the number of the pseudo-touch lines P-TL may be smaller than the number of the X-touch lines X-TL, and the line width of the pseudo-touch line P-TL may be thicker than the line width of the X-touch line X-TL.

Electromagnetic interference caused by the touch driving signal may be canceled out by applying a pseudo-touch driving signal opposite in phase to the touch driving signal supplied through the plurality of X-touch electrode lines X-TEL1 to X-TEL30 to the pseudo-touch electrode line P-TEL positioned in the non-display area NDA.

In this case, one pseudo-touch electrode line P-TEL may be connected to one pseudo-touch line P-TL. Alternatively, a plurality of pseudo-touch electrode lines P-TEL spaced apart at regular intervals may be connected to one pseudo-touch line P-TL, thereby effectively reducing electromagnetic noise caused by a wireless signal or the like.

Figure 6:
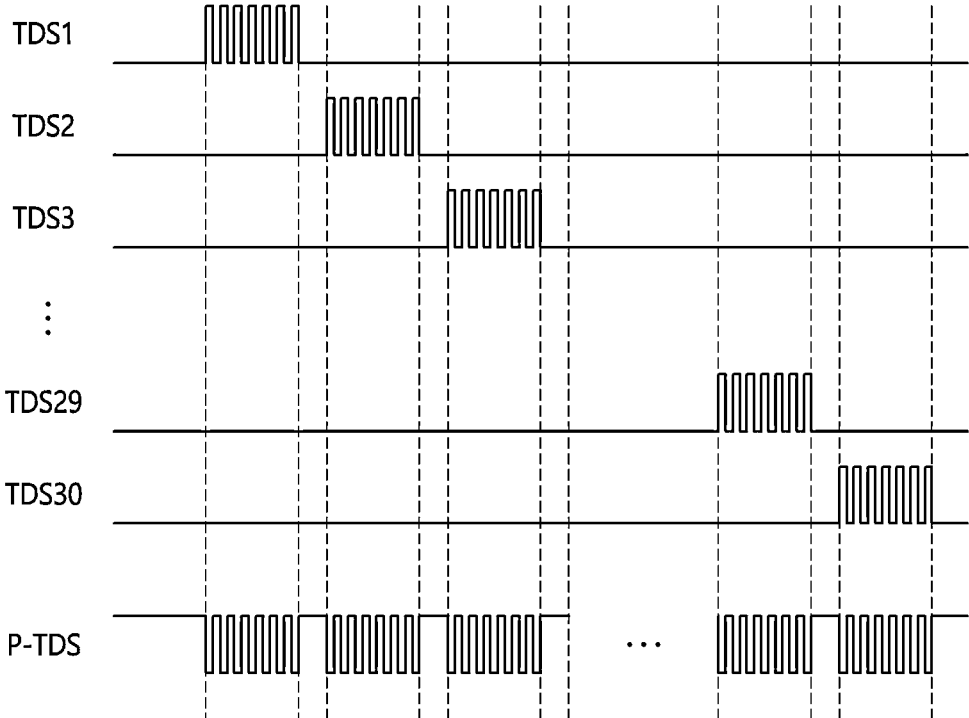
FIG. 6 is a view illustrating example waveforms of a touch driving signal applied to a plurality of touch electrode lines and a pseudo-touch driving signal applied to a pseudo-touch electrode line in a touch display device according to embodiments of the disclosure.

FIG. 6 is a view illustrating example waveforms of a touch driving signal applied to a plurality of touch electrode lines and a pseudo-touch driving signal applied to a pseudo-touch electrode line in a touch display device according to embodiments of the disclosure.

Referring to FIG. 6, in the touch display device 100 according to embodiments of the disclosure, a plurality of X-touch electrode lines X-TEL may be disposed in the display area DA of the display panel 110. Here, an example in which 30 X-touch electrode lines X-TEL1 to X-TEL30 are disposed is described.

When the 30 X-touch electrode lines X-TEL1 to X-TEL30 are disposed in the display area DA of the display panel 110, pulse-type touch driving signals TDS1 to TDS30 may be applied to the 30 X-touch electrode lines X-TEL1 to X-TEL30 at different times.

In this case, a pseudo-touch driving signal P-TDS having a phase opposite to that of the touch driving signals TDS1 to TDS30 may be applied to the pseudo-touch electrode line P-TEL.

Here, an example in which one pseudo-touch line P-TL or one pseudo-touch electrode line P-TEL corresponds to 30 X-touch electrode lines X-TEL1 to X-TEL30 is illustrated, and the number of pseudo-touch lines P-TL or pseudo-touch electrode lines P-TEL may be variously formed.

As described above, the pseudo-touch driving signal P-TDS opposite in phase to the touch driving signals TDS1 to TDS30 supplied through the plurality of X-touch electrode lines X-TEL1 to X-TEL30 may be applied through the pseudo-touch line P-TL and the pseudo-touch electrode line P-TEL positioned in the non-display area, thereby canceling out electromagnetic noise caused by the touch driving signal TDS.

In this case, the pseudo-touch line P-TL and the pseudo-touch electrode line P-TEL are disposed in the non-display area corresponding to the outer periphery of the display panel 110, whereas the plurality of touch electrode lines X-TEL1 to X-TEL30 are disposed in parallel within the display area DA of the display panel 110.

As a result, the pseudo-touch driving signal P-TDS transferred through the pseudo-touch line P-TL and the touch driving signals TDS1 to TDS30 transferred through the X-touch line X-TL may differ in signal delay due to a resistance-capacitance (RC) value.

Figure 7:
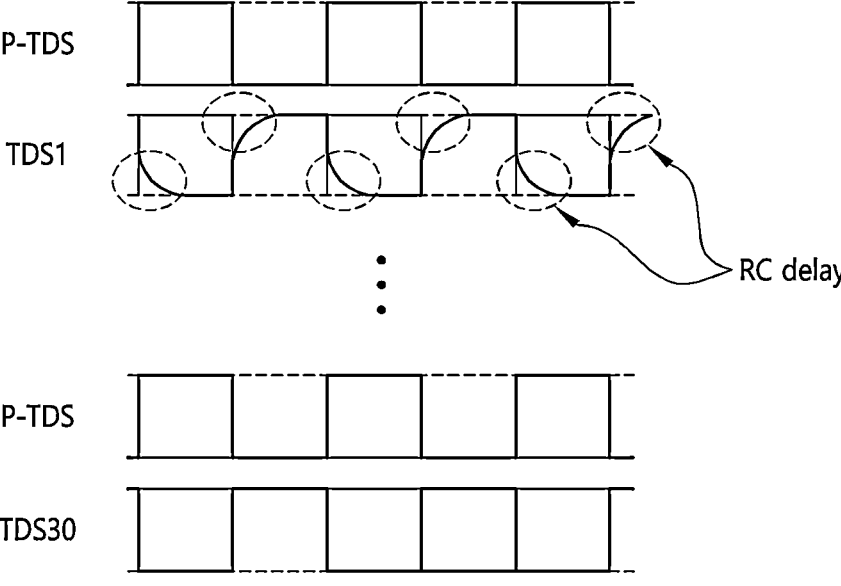
FIG. 7 is a view illustrating an example signal delay between a touch driving signal and a pseudo-touch driving signal in a touch display device according to embodiments of the disclosure.

FIG. 7 is a view illustrating an example signal delay between a touch driving signal and a pseudo-touch driving signal in a touch display device according to embodiments of the disclosure.

Referring to FIG. 7, in the touch display device 100 according to embodiments of the disclosure, e.g., 30 X-touch electrode lines X-TEL1 to X-TEL30 may be arranged side by side in the display area DA of the display panel 110 in the first direction.

Further, the pseudo-touch line P-TL and the pseudo-touch electrode line P-TEL may be disposed in the non-display area corresponding to the outer periphery of the display panel 110.

In this case, the first touch driving signal TDS1 to the 30th touch driving signal TDS30 may be applied through 30

X-touch electrode lines X-TEL1 to X-TEL30 disposed in the first direction in the display area DA.

Since the 30th X-touch electrode line X-TEL30 to which the 30th touch driving signal TDS30 is applied is disposed at a position closest to the touch circuit 150, the 30th touch driving signal TDS30 rarely causes no or little signal delay.

On the other hand, since the first X-touch electrode line X-TEL1 to which the first touch driving signal TDS1 is applied is disposed at the farthest position from the touch circuit 150, it causes a significant time delay.

Meanwhile, since the pseudo-touch line P-TL to which the pseudo-touch driving signal P-TDS is applied has a large line width, the pseudo-touch driving signal P-TDS transferred through the pseudo-touch line P-TL causes no or little signal delay.

Accordingly, the signal delay deviation between the first touch driving signal TDS1 and the pseudo-touch driving signal P-TDS transferred through the first X-touch line X-TL1 connected to the farthest position of the touch circuit 150 is the largest.

The touch display device 100 according to the disclosure may reduce the resistance of the X-touch line connected to the position far from the touch circuit 150, thereby reducing the signal delay deviation between the pseudo-touch driving signal P-TDS and the touch driving signal, and hence effectively canceling out electromagnetic noise.

Figure 8:
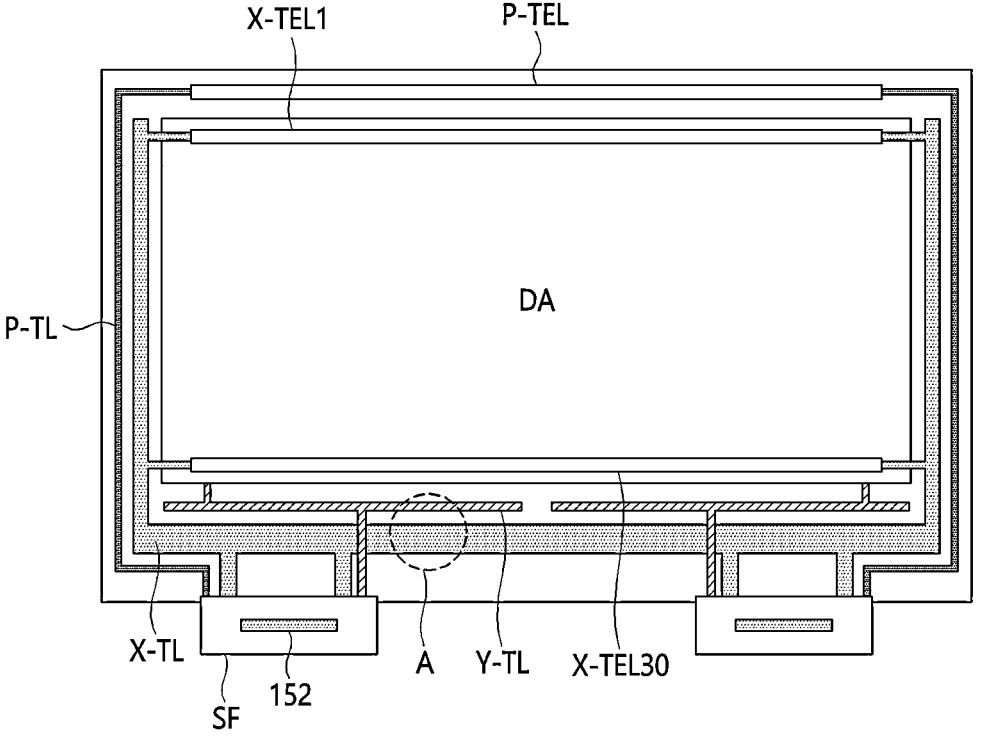
FIG. 8 is a view illustrating an example structure of a touch line and a pseudo-touch line disposed in a non-display area in a touch display device according to embodiments of the disclosure.
Figure 9:
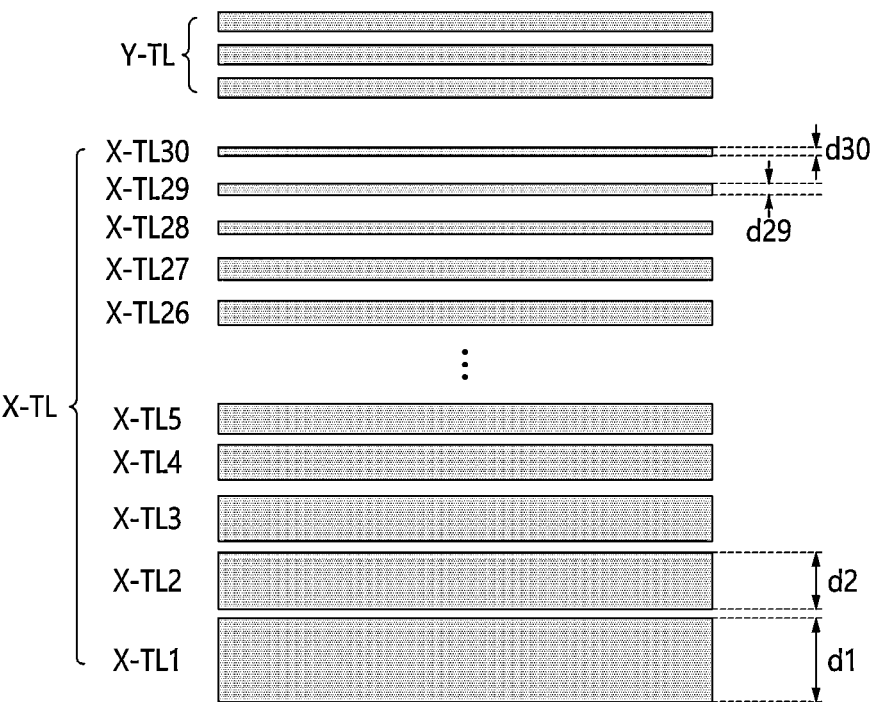
FIGS. 9 and 10 are enlarged view illustrating area A of FIG. 8 according to embodiments of the disclosure.
Figure 10:
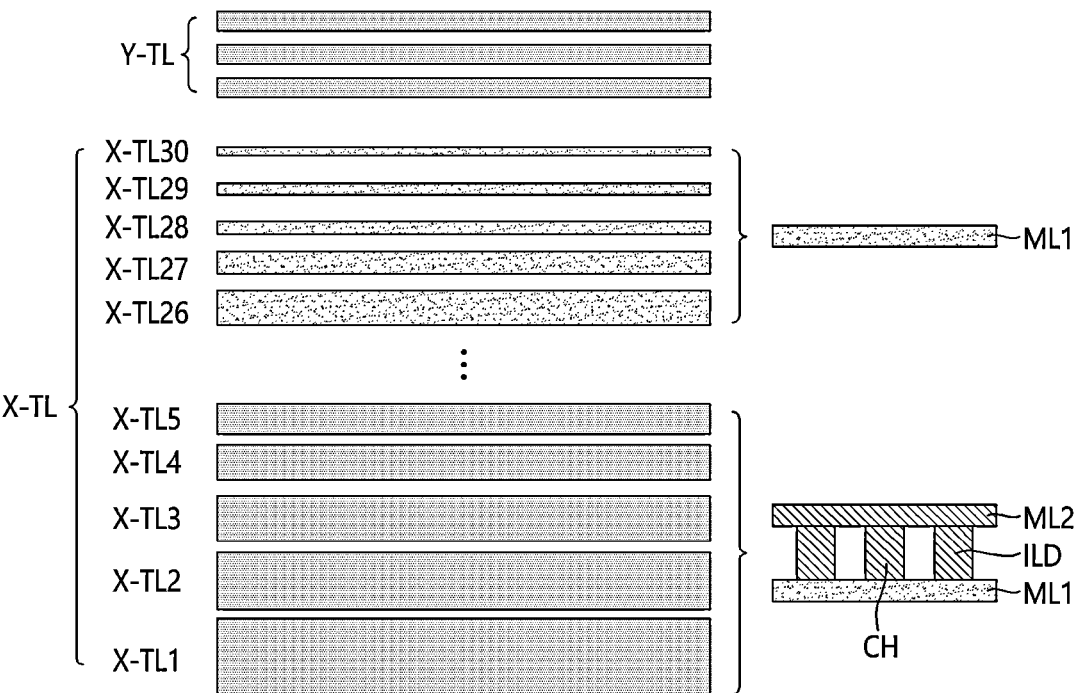

FIG. 8 is a view illustrating an example structure of a touch line and a pseudo-touch line disposed in a non-display area in a touch display device according to embodiments of the disclosure. FIGS. 9 and 10 are enlarged view illustrating area A of FIG. 8.

Referring to FIGS. 8 to 10, the touch display device 100 according to embodiments of the disclosure may include a plurality of X-touch electrode lines X-TEL1 to X-TEL30 and a plurality of Y-touch electrode lines (not shown) disposed in the display area DA of the display panel 110, and a pseudo-touch electrode line P-TEL disposed in the non-display area NDA.

A touch driving signal is applied to each of the plurality of X-touch electrode lines X-TEL1 to X-TEL30 through a plurality of X-touch lines X-TL extending along the non-display area from the touch driving circuit 152 mounted on the source film SF.

In other words, a first touch driving signal is applied to the first X-touch electrode line X-TEL1 through the first X-touch line X-TL1, and a 30th touch driving signal is applied to the 30th touch electrode line X-TEL30 through the 30th X-touch line X-TL30.

In this case, the X-touch line X-TL may be disposed to be connected from the left side to the right side from the lower non-display area of the display panel 110. In this case, one touch driving signal transferred through the X-touch line X-TL may be supplied to both the left and right sides of the X-touch electrode line X-TEL. As such, a structure in which touch driving signals are simultaneously applied to two opposite sides of the X-touch electrode line X-TEL may be referred to as a multi-feeding structure. In the multi-feeding structure, since the touch driving signal is simultaneously applied to two opposite sides of the X-touch electrode line, the touch driving signal may be stably transferred and the touch sensing performance may be enhanced.

Meanwhile, the number of the pseudo-touch lines P-TL may be smaller than (i.e., less than) the number of the X-touch lines X-TL, and the line width of the pseudo-touch line P-TL may be thicker than the line width of the X-touch line X-TL.

Electromagnetic interference caused by the touch driving signal may be canceled out by applying a pseudo-touch driving signal opposite in phase to the touch driving signal supplied through the plurality of X-touch electrode lines X-TEL1 to X-TEL30 to the pseudo-touch electrode line P-TEL positioned in the non-display area NDA.

Here, the first X-touch electrode line X-TEL1 may be disposed at the farthest position from the touch circuit 150, and the 30th X-touch electrode line X-TEL30 may be disposed at the closest position from the touch circuit 150.

In this case, in order to reduce the deviation of the signal delay for the touch driving signal TDS transferred through the X-touch line X-TL, the line width may be determined to reduce the resistance component of the X-touch line connected to a position far from the touch circuit 150.

For example, as illustrated in FIG. 9, as compared with the line width d30 of the 30th X-touch line X-TL30 connected to the closest position to the touch circuit 150, the line width d29 of the 29th X-touch line X-TL29 connected to the farther position may be larger. As such, the line width d1 of the first X-touch line X-TL1 connected to the farthest position from the touch circuit 150 may be formed to be the largest.

As a result, an X-touch line connected to a position farther from the touch circuit 150 may have a larger line width and thus a resistance component may be reduced, thereby reducing a signal delay due to resistance-capacitance. Accordingly, the signal delay deviation with the pseudo-touch driving signal P-TDS transferred along the pseudo-touch line P-TL may be reduced, and the canceling-out effect of electromagnetic noise may be enhanced.

Meanwhile, in order to reduce the resistance component of the X-touch line connected to a position far from the touch circuit 150, the line width may be increased, but the resistance component may be reduced through dual line.

For example, as illustrated in FIG. 10, some X-touch lines (e.g., X-TL26 to X-TL30) connected close to the touch circuit 150 among the plurality of X-touch lines X-TL disposed in the lower non-display area of the display panel 110 are formed as a single metal line ML1. The X-touch lines formed of a single metal wire ML1 may be referred to as a single touch line group.

On the other hand, other X-touch lines (e.g., X-TL1 to X-TL5) connected far from the touch circuit 150 are formed as dual line of the first metal line ML1 and the second metal line ML2. The touch line group formed as dual line may be referred to as a dual touch line group. The first metal line ML1 and the second metal line ML2 may be insulated by an insulation film ILD, and a partial area thereof may be connected to the contact hole CH.

As described above, when some X-touch lines (e.g., X-TL1 to X-TL5) connected far from the touch circuit 150 are formed of a dual metal line, the resistance is lower than that of other X-touch lines connected close to the touch circuit 150, and thus the signal delay of the touch driving signal may be reduced.

Figures 11A, 11B:
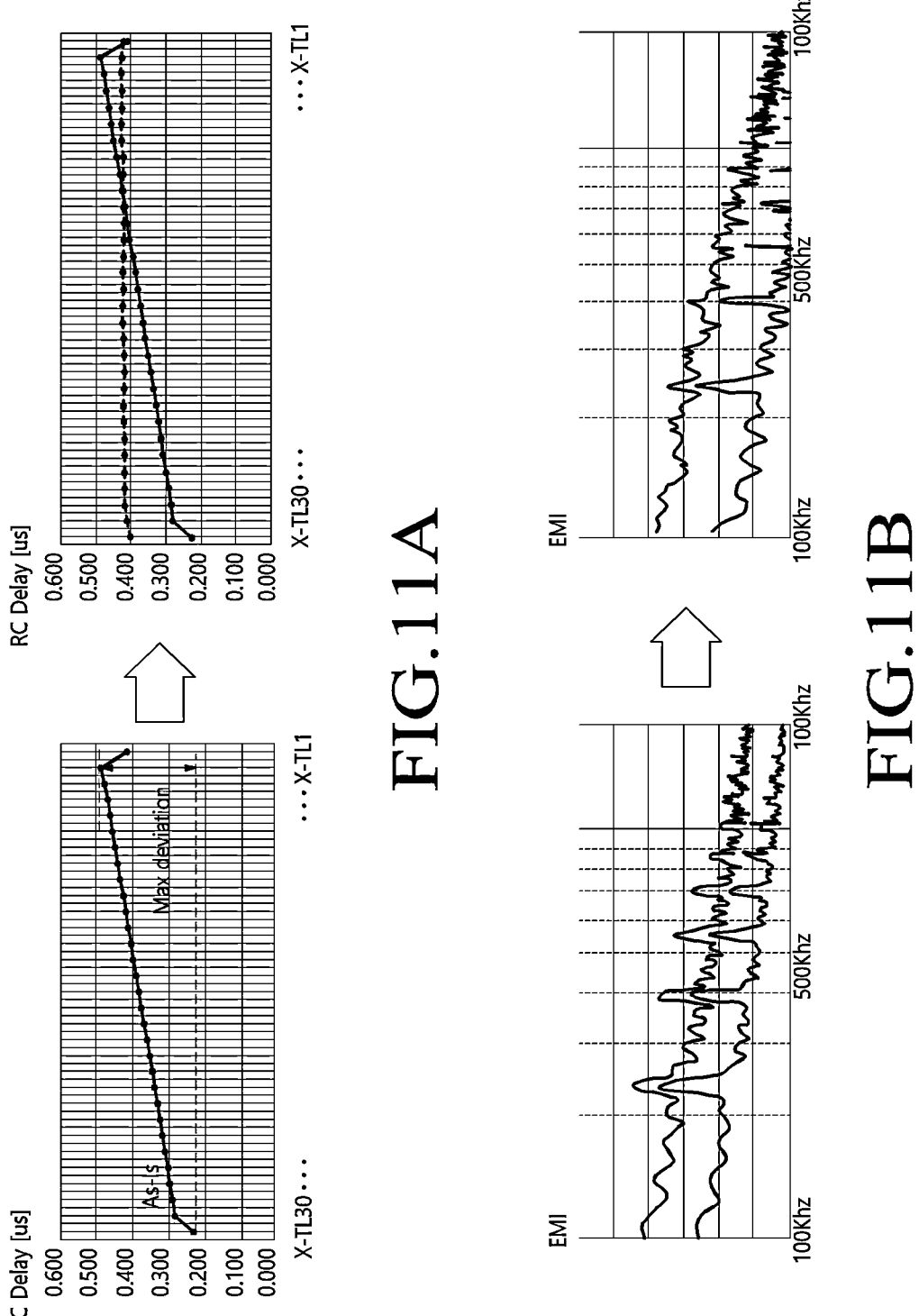
FIGS. 11A and 11B are views illustrating measurement values of comparison of electromagnetic interference and signal delay according to the line width of a touch line disposed in a non-display area at a lower end of a display panel in a touch display device according to embodiments of the disclosure.

FIGS. 11A and 11B are views illustrating measurement values of comparison of electromagnetic interference and signal delay according to the line width of a touch line disposed in a non-display area at a lower end of a display panel in a touch display device according to embodiments of the disclosure.

Referring to FIGS. 11A and 11B, in the touch display device according to embodiments of the disclosure, a X-touch line connected to a position far from the touch circuit 150 may be formed to have a larger line width or may be formed as a dual line.

As a result, the signal delay of the touch driving signal transferred from the touch circuit 150 to a distant position may be reduced (FIG. 11A), and the canceling-out effect of electromagnetic interference may be enhanced (FIG. 11B).

Meanwhile, in the touch display device 100 of the disclosure, the X-touch line X-TL may be formed in a closed loop structure in a non-display area at the lower end of the display panel 110.

Figure 12:
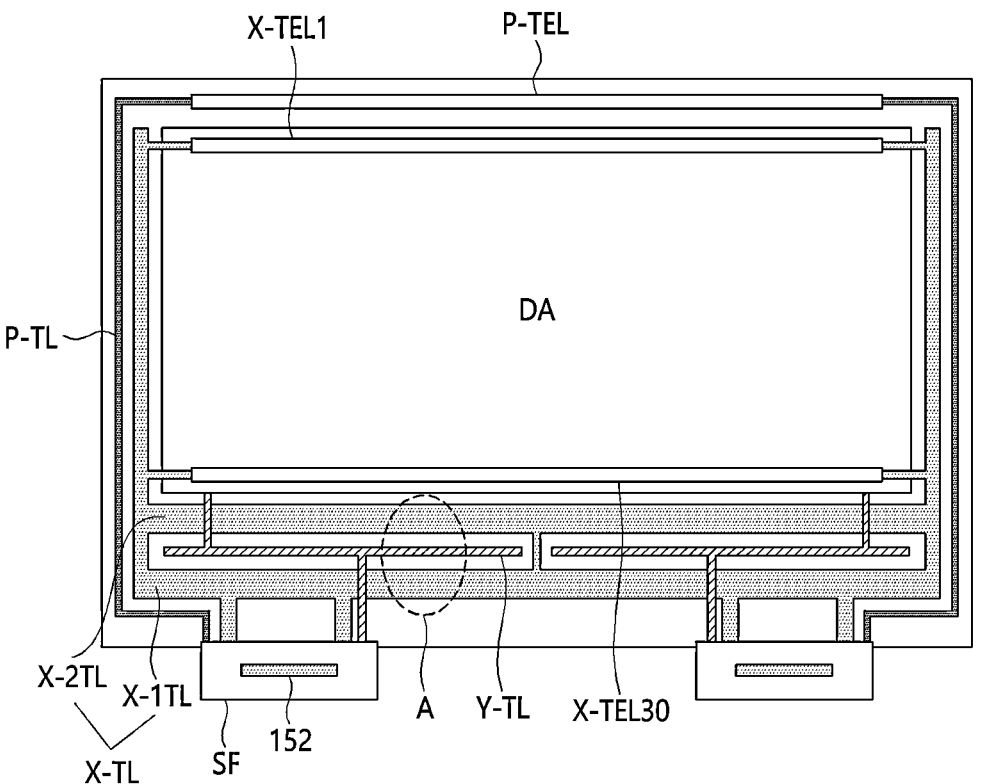
FIG. 12 is a view illustrating an example in which an X-touch line disposed in a non-display area is formed in a closed loop structure in a touch display device according to embodiments of the disclosure.
Figure 13:
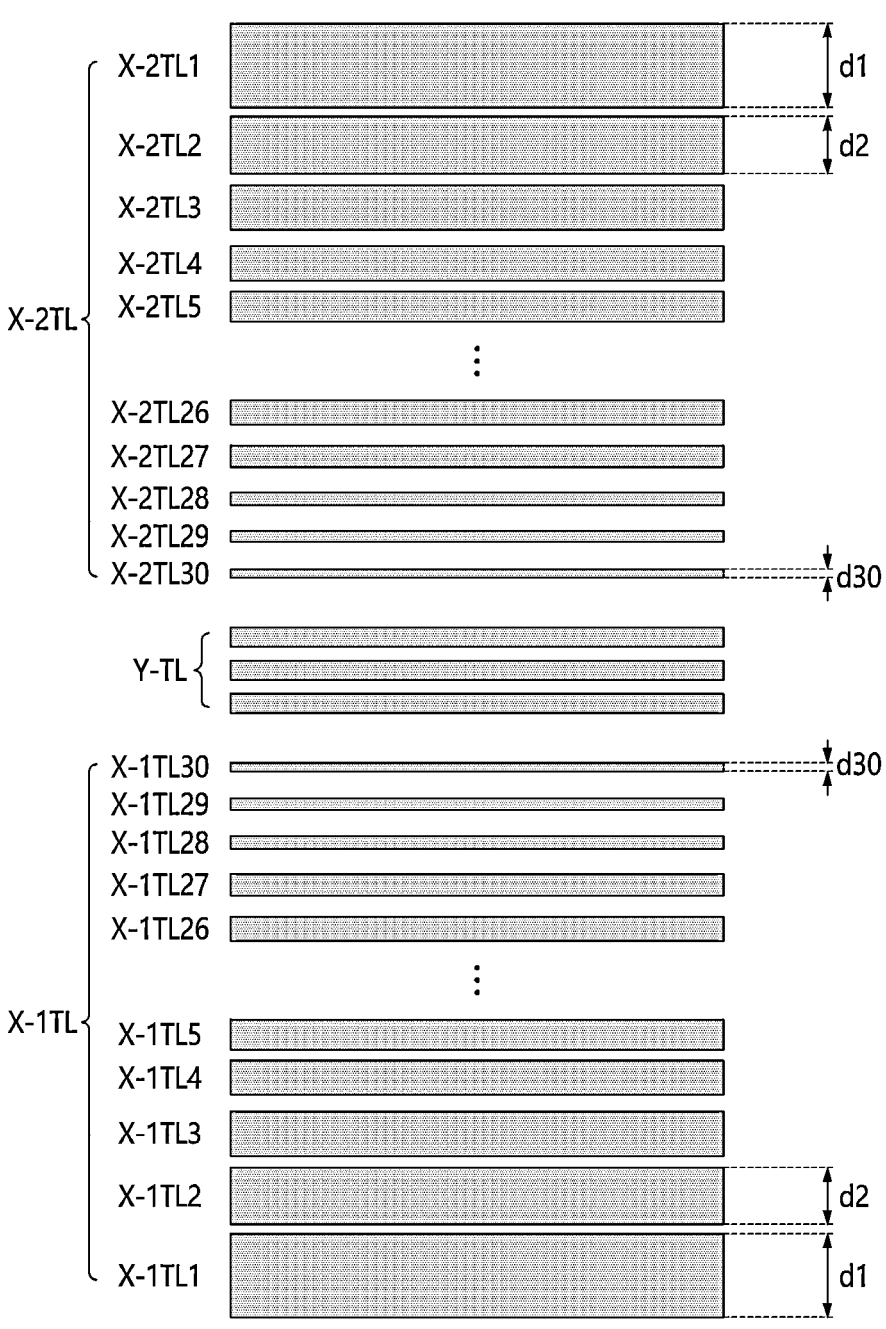
FIGS. 13 and 14 are enlarged view illustrating area B of FIG. 12 according to embodiments of the disclosure.
Figure 14:
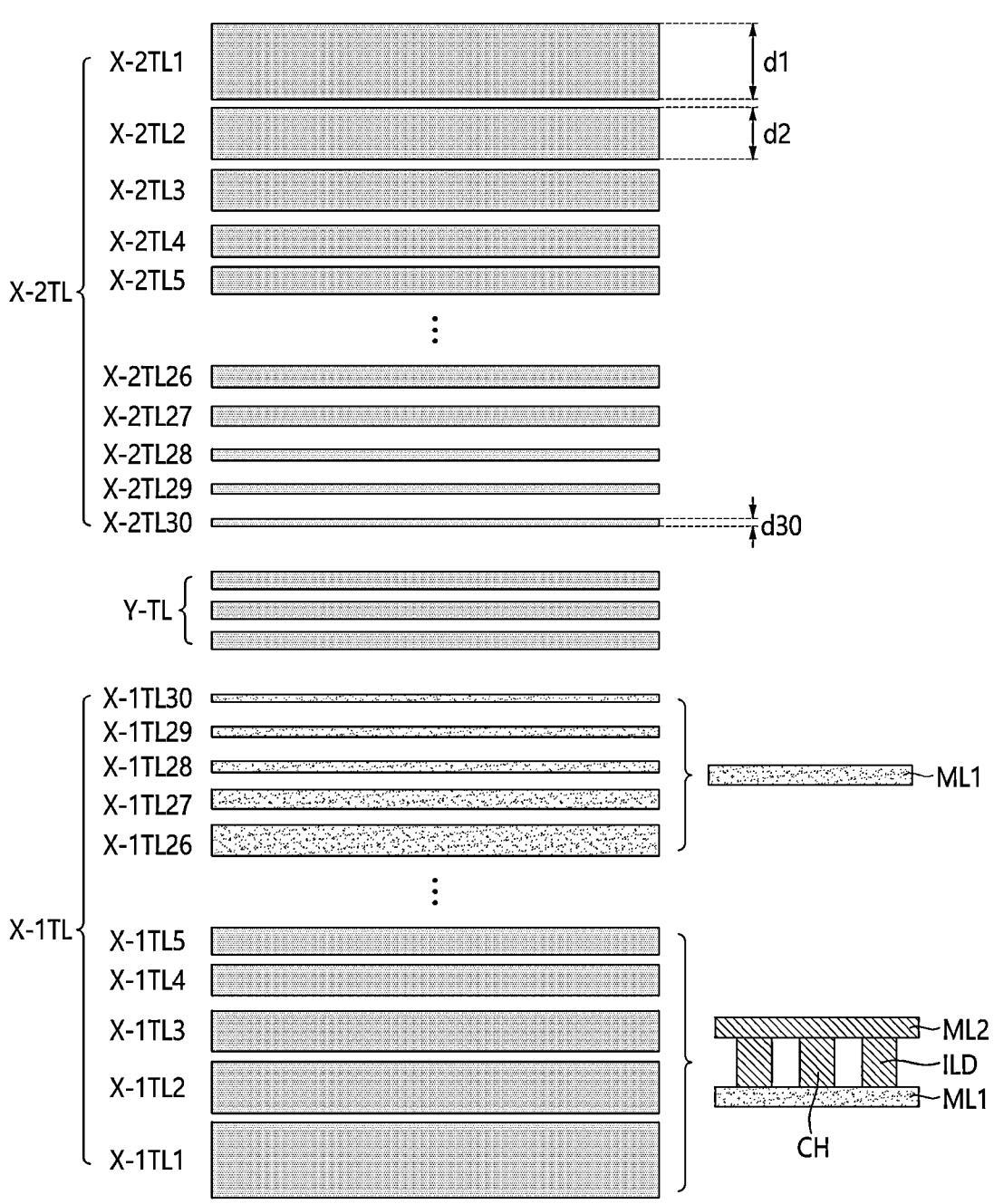

FIG. 12 is a view illustrating an example in which an X-touch line disposed in a non-display area is formed in a closed loop structure in a touch display device according to embodiments of the disclosure. FIGS. 13 and 14 are enlarged views illustrating area B of FIG. 12 according to embodiments of the disclosure.

Referring to FIGS. 12 to 14, the touch display device 100 according to embodiments of the disclosure may include a plurality of X-touch electrode lines X-TEL1 to X-TEL30 and a plurality of Y-touch electrode lines (not shown) disposed in the display area DA of the display panel 110, and a pseudo-touch electrode line P-TEL disposed in the non-display area NDA.

A touch driving signal is applied to each of the plurality of X-touch electrode lines X-TEL1 to X-TEL30 through a plurality of X-touch lines X-TL extending along the non-display area from the touch driving circuit 152 mounted on the source film SF.

In other words, a first touch driving signal is applied to the first X-touch electrode line X-TEL1 through the first X-touch line X-TL1, and a 30th touch driving signal is applied to the 30th touch electrode line X-TEL30 through the 30th X-touch line X-TL30.

In this case, the X-touch line X-TL may be disposed to be connected from the left side to the right side from the lower non-display area of the display panel 110. In this case, one touch driving signal transferred through the X-touch line X-TL may be supplied to both the left and right sides of the X-touch electrode line X-TEL. As such, a structure in which touch driving signals are simultaneously applied to two opposite sides of the X-touch electrode line X-TEL may be referred to as a multi-feeding structure. In the multi-feeding structure, since the touch driving signal is simultaneously applied to two opposite sides of the X-touch electrode line, the touch driving signal may be stably transferred and the touch sensing performance may be enhanced.

Further, the X-touch line X-TL disposed in the non-display area at the lower end of the display panel 110 may include a first group X-touch line X-1TL positioned below the Y-touch line Y-TL and a second group X-touch line X-2TL positioned above the Y-touch line Y-TL. The first group X-touch line X-1TL and the second group X-touch line X-2TL may be connected to each other while forming a closed loop.

Meanwhile, the number of the pseudo-touch lines P-TL may be smaller than (i.e., less than) the number of the X-touch lines X-TL, and the line width of the pseudo-touch line P-TL may be thicker than the line width of the X-touch line X-TL.

Electromagnetic interference caused by the touch driving signal may be canceled out by applying a pseudo-touch driving signal opposite in phase to the touch driving signal supplied through the plurality of X-touch electrode lines X-TEL1 to X-TEL30 to the pseudo-touch electrode line P-TEL positioned in the non-display area NDA.

The first group X-touch lines X-1TL may include a first X-touch line X-1TL1 connected to the first X-touch electrode line X-TEL1 farthest from the touch circuit 150 and a 30th X-touch line X-1TL30 connected to the 30th X-touch electrode line X-TEL30 closest to the touch circuit 150.

Similarly, the second group X-touch lines X-2TL may include a first X-touch line X-2TL1 connected to the first X-touch electrode line X-TEL1 farthest from the touch circuit 150 and a 30th X-touch line X-2TL30 connected to the 30th X-touch electrode line X-TEL30 closest to the touch circuit 150.

The first X-touch line X-1TL1 belonging to the first group X-touch line X-1TL is connected to the first X-touch line X-2TL1 belonging to the second group X-touch line X-2TL, and the 30th X-touch line X-1TL30 belonging to the first group X-touch line X-1TL is connected to the 30th X-touch line X-2TL30 belonging to the second group X-touch line X-2TL.

In this case, in order to reduce the deviation of the signal delay for the touch driving signal TDS transferred through the X-touch line X-TL, the line width may be determined to reduce the resistance component of the X-touch line connected to a position far from the touch circuit 150.

For example, as illustrated in FIG. 13, as compared with the line width d30 of the 30th X-touch line X-1TL30 or X-2TL30 connected to the closest position to the touch circuit 150, the line width d29 of the 29th X-touch line X-1TL29 or X-2TL29 connected to the farther position may be larger. As such, the line width d1 of the first X-touch line X-1TL1 or X-2TL1 connected to the farthest position from the touch circuit 150 may be formed to be the largest.

As a result, an X-touch line connected to a position farther from the touch circuit 150 may have a larger line width and thus a resistance component may be reduced, thereby reducing a signal delay due to resistance-capacitance. Accordingly, the signal delay deviation with the pseudo-touch driving signal P-TDS transferred along the pseudo-touch line P-TL may be reduced, and the canceling-out effect of electromagnetic noise may be enhanced.

Meanwhile, in order to reduce the resistance component of the X-touch line connected to a position far from the touch circuit 150, the line width may be increased, but the resistance component may be reduced through dual line.

For example, as illustrated in FIG. 14, some X-touch lines (e.g., X-TL26 to X-TL30) connected close to the touch circuit 150 among the first group X-touch lines X-1TL disposed in the lower non-display area of the display panel 110 are formed as a single metal line ML1.

On the other hand, other X-touch lines (e.g., X-1TL1 to X-1TL5) connected far from the touch circuit 150 are formed as dual metal line of the first metal line ML1 and the second metal line ML2. The first metal line ML1 and the second metal line ML2 may be insulated by an insulation film ILD, and a partial area thereof may be connected to the contact hole CH.

As described above, when some X-touch lines (e.g., X-1TL1 to X-1TL5) connected far from the touch circuit 150 are formed as dual lines, the resistance is lower than that of some other X-touch lines (e.g., X-1TL26 to X-1TL30), and thus the signal delay of the touch driving signal may be reduced.

This structure may be equally applied to the second group X-touch lines X-2TL.

Embodiments of the disclosure described above are briefly described below.

A touch display device according to embodiments of the disclosure may comprise a display panel including a plurality of touch electrode lines disposed in a display area and at least one pseudo-touch electrode line disposed in a non-display area and a touch circuit supplying a touch driving signal through a plurality of touch lines respectively connected to the plurality of touch electrode lines and supplying a pseudo-touch driving signal having a phase opposite to that of the touch driving signal through a pseudo-touch line connected to the at least one pseudo-touch electrode line. At least some of the plurality of touch lines may be formed to have different line widths according to positions of the plurality of touch electrode lines.

At least some of the plurality of touch lines may be formed to have different line widths in the non-display area of the display panel adjacent to the touch circuit.

At least some of the plurality of touch lines may be formed to have a larger line width as touch electrode lines connected thereto are farther from the touch circuit.

At least some of the plurality of touch lines may include a single touch line group formed of a single metal line and a dual touch line group formed of a dual metal line.

The single touch line group may be connected to a first touch electrode line group close to the touch circuit, and the dual touch line group may be connected to a second touch electrode line group farther than the first touch electrode line group.

The dual metal line may include a first metal line, a second metal line formed on a layer different from the first metal line, an insulation film disposed between the first metal line and the second metal line, and a contact hole connecting the first metal line and the second metal line in a partial area.

The plurality of touch lines may be connected to two opposite sides of the plurality of touch electrode lines to simultaneously apply the touch driving signal.

The plurality of touch lines may include a first group touch line positioned on one side of a touch sensing line receiving a touch sensing signal, and a second group touch line positioned on another side of the touch sensing line.

The first group touch line and the second group touch line may be connected to each other while forming a closed loop.

The first group touch line and the second group touch line may be formed to have a larger line width as a touch electrode line connected thereto is farther from the touch circuit.

At least one of the first group touch line and the second group touch line may include a single touch line group formed of a single metal line, and a dual touch line group formed of a dual metal line.

The single touch line group may be connected to a first touch electrode line group close to the touch circuit, and the dual touch line group may be connected to a second touch electrode line group farther than the first touch electrode line group.

The non-display area may be an outer area of the display area, and the at least one pseudo-touch electrode line may be in parallel with the plurality of touch electrode lines.

The number of the pseudo-touch line may be smaller than the number of the touch lines, and a line width of the pseudo-touch line may be thicker than a line width of touch lines.

A touch display device according to the disclosure may comprise a display panel including a plurality of touch electrode lines disposed in a display area and at least one pseudo-touch electrode line disposed in a non-display area and a touch circuit supplying a touch driving signal through a plurality of touch lines respectively connected to the plurality of touch electrode lines and supplying a pseudo-touch driving signal having a phase opposite to that of the touch driving signal through a pseudo-touch line connected to the at least one pseudo-touch electrode line. The plurality of touch lines may include a single touch line group formed of a single metal line and a dual touch line group formed of a dual metal line.

A display panel according to the disclosure may comprise a plurality of touch electrode lines disposed in a display area, at least one pseudo-touch electrode line disposed in a non-display area, a plurality of touch lines connected to the plurality of touch electrode lines, respectively, to transfer a touch driving signal, and at least one pseudo-touch line connected to the at least one pseudo-touch electrode line to transfer a pseudo-touch driving signal having a phase opposite to that of the touch driving signal. At least some of the plurality of touch lines may be formed to have different line widths according to positions of the plurality of touch electrode lines.

The above description has been presented to enable any person skilled in the art to make and use the technical idea of the disclosure, and has been provided in the context of a particular application and its requirements. Various modifications, additions and substitutions to the described embodiments will be readily apparent to those skilled in the art, and the general principles defined herein may be applied to other embodiments and applications without departing from the spirit and scope of the disclosure. The above description and the accompanying drawings provide an example of the technical idea of the disclosure for illustrative purposes only. That is, the disclosed embodiments are intended to illustrate the scope of the technical idea of the disclosure.

What is claimed:

1. A touch display device, comprising:

a display panel including a plurality of touch electrode lines extending in a first direction in a display area of the display panel and at least one pseudo-touch electrode line extending in the first direction in a first non-display area of the display panel; and a touch circuit configured to supply a touch driving signal through a plurality of touch lines respectively connected to the plurality of touch electrode lines and supply a pseudo-touch driving signal having a phase that is opposite to that of a phase of the touch driving signal through a pseudo-touch line connected to the at least one pseudo-touch electrode line in a second non-display area opposite the first non-display area based on the display area, a first touch line of the plurality of touch lines connected to a first touch electrode line of the plurality of touch electrode lines, a second touch line of the plurality of touch lines connected to a second touch electrode line of the plurality of touch electrode lines, wherein the first touch line includes a first portion of a first width extending in the first direction in the second non-display area, a second portion extending in a second direction intersecting the first direction, and a third portion extending in the first direction and connected to the first touch electrode line, the first portion of the first touch line closer to the touch circuit than the second portion of the first touch line and the third portion of the first touch line, wherein the second touch line includes a first portion of a second width extending in the first direction in the second non-display area, a second portion extending in the second direction, and a third portion extending in the first direction and connected to the second touch electrode line, the first portion of the second touch line closer to the touch circuit than the second portion of the second touch line and the third portion of the second touch line, wherein the first width of the first portion of the first touch line is greater than the second width of the first portion of the second touch line in the second non-display area, and wherein the first touch electrode line is further from the touch circuit than the second touch electrode line in a plan view of the touch display device.

2. The touch display device of claim 1, wherein at least some of the plurality of touch lines have different line widths in the second non-display area of the display panel adjacent to the touch circuit.

3. The touch display device of claim 1, wherein at least some of the plurality of touch lines have a larger line width as touch electrode lines connected thereto are farther from the touch circuit that other touch lines of the plurality of touch lines.

4. The touch display device of claim 1, wherein at least some of the plurality of touch lines include:

a single touch line group including a single metal line; and a dual touch line group including a dual metal line.

5. The touch display device of claim 4, wherein the single touch line group is connected to a first touch electrode line group, and wherein the dual touch line group is connected to a second touch electrode line group that is farther from the touch circuit than the first touch electrode line group.

6. The touch display device of claim 4, wherein the dual metal line includes:

a first metal line;

a second metal line on a layer different from the first metal line;

an insulation film between the first metal line and the second metal line; and a contact hole that connects the first metal line and the second metal line in a partial area.

7. The touch display device of claim 1, wherein the plurality of touch lines are connected to two opposite sides of the plurality of touch electrode lines to simultaneously apply the touch driving signal.

8. The touch display device of claim 1, wherein the plurality of touch lines include:

a first group touch line on one side of a touch sensing line receiving a touch sensing signal; and a second group touch line on another side of the touch sensing line.

9. The touch display device of claim 8, wherein the first group touch line and the second group touch line have a larger line width as a touch electrode line connected thereto is farther from the touch circuit than another touch electrode line.

10. The touch display device of claim 8, wherein each of the first group touch line and the second group touch line includes:

a single touch line group having a single metal line; and a dual touch line group having a dual metal line.

11. The touch display device of claim 10, wherein the single touch line group is connected to a first touch electrode line group, and the dual touch line group is connected to a second touch electrode line group that is farther from the touch circuit than the first touch electrode line group.

12. The touch display device of claim 8, wherein the first group touch line and the second group touch line are connected to each other and form a closed loop.

13. The touch display device of claim 1, wherein the first non-display area is an outer area of the display area, and the at least one pseudo-touch electrode line is in parallel with the plurality of touch electrode lines.

14. The touch display device of claim 1, wherein a number of the pseudo-touch line is less than a number of the plurality of touch lines, and a line width of the pseudo-touch line is thicker than a line width of plurality of touch lines.

15. A touch display device, comprising:

a display panel including a plurality of touch electrode lines extending in a first direction in a display area of the display panel and at least one pseudo-touch electrode line extending in the first direction in a first non-display area of the display panel; and a touch circuit configured to supply a touch driving signal through a plurality of touch lines respectively connected to the plurality of touch electrode lines and supply a pseudo-touch driving signal having a phase that is opposite to a phase of the touch driving signal through a pseudo-touch line connected to the at least one pseudo-touch electrode line in a second non-display area opposite the first non-display area based on the display area, a first touch line of the plurality of touch lines connected to a first touch electrode line of the plurality of touch electrode lines, a second touch line of the plurality of touch lines connected to a second touch electrode line of the plurality of touch electrode lines, wherein the plurality of touch lines include a single touch line group having a single metal line and a dual touch line group having a dual metal line, wherein the first touch line includes a first portion of a first width extending in the first direction in the second non-display area, a second portion extending in a second direction intersecting the first direction, and a third portion extending in the first direction and connected to the first touch electrode line, the first portion of the first touch line closer to the touch circuit than the second portion of the first touch line and the third portion of the first touch line, wherein the second touch line includes a first portion of a second width extending in the first direction in the second non-display area, a second portion extending in the second direction, and a third portion extending in the first direction and connected to the second touch electrode line, the first portion of the second touch line closer to the touch circuit than the second portion of the second touch line and the third portion of the second touch line, wherein the first width of the first portion of the first touch line is greater than the second width of the first portion of the second touch line in the second non-display area, and wherein the first touch electrode line is further from the touch circuit than the second touch electrode line in a plan view of the touch display device.

16. The touch display device of claim 15, wherein the single touch line group is connected to a first touch electrode line group, and the dual touch line group is connected to a second touch electrode line group that is farther from the touch circuit than the first touch electrode line group.

17. The touch display device of claim 15, wherein the first non-display area is an outer area of the display area, and the at least one pseudo-touch electrode line is in parallel with the plurality of touch electrode lines.

18. The touch display device of claim 15, wherein a number of pseudo-touch lines is less than a number of the plurality of touch lines, and a line width of the pseudo-touch line is thicker than a line width of the plurality of touch lines.

19. A display panel, comprising:

a plurality of touch electrode lines extending in a first direction in a display area of the display panel;

at least one pseudo-touch electrode line extending in the first direction in a first non-display area of the display panel;

a plurality of touch lines connected to the plurality of touch electrode lines, the plurality of touch lines transferring a touch driving signal from a touch circuit, a first touch line of the plurality of touch lines connected to a first touch electrode line of the plurality of touch electrode lines, a second touch line of the plurality of touch lines connected to a second touch electrode line of the plurality of touch electrode lines; and at least one pseudo-touch line connected to the at least one pseudo-touch electrode line, the at least one pseudo-touch line transferring a pseudo-touch driving signal having a phase opposite to a phase of the touch driving signal, wherein the first touch line includes a first portion of a first width extending in the first direction in a second non-display area, a second portion extending in a second direction intersecting the first direction, and a third portion extending in the first direction and connected to the first touch electrode line, the first portion of the first touch line closer to the touch circuit than the second portion of the first touch line and the third portion of the first touch line, wherein the second touch line includes a first portion of a second width extending in the first direction in the second non-display area, a second portion extending in the second direction, and a third portion extending in the first direction and connected to the second touch electrode line, the first portion of the second touch line closer to the touch circuit than the second portion of the second touch line and the third portion of the second touch line, wherein the first width of the first portion of the first touch line is greater than the second width of the first portion of the second touch line in the second non-display area, and wherein the first touch electrode line is further from the touch circuit than the second touch electrode line in a plan view of the display panel.

20. The display panel of claim 19, wherein at least some of the plurality of touch lines have different line widths in the second non-display area that is adjacent to a touch circuit, the touch circuit is connected to the plurality of touch lines and the at least one pseudo-touch line.

21. The display panel of claim 19, wherein at least some of the plurality of touch lines have a larger line width as touch electrode lines connected thereto are farther from a touch circuit than other touch lines from the plurality of touch lines, the touch circuit is connected to the plurality of touch lines and the at least one pseudo-touch line.

22. The display panel of claim 19, wherein at least some of the plurality of touch lines include:

a single touch line group having a single metal line; and a dual touch line group having a dual metal line.

23. The display panel of claim 22, wherein the single touch line group is connected to a first touch electrode line group, and the dual touch line group is connected to a second touch electrode line group that is farther from a touch circuit than the first touch electrode line group, wherein the touch circuit is connected to the plurality of touch lines and the at least one pseudo-touch line.

24. The display panel of claim 19, wherein the first non-display area is an outer area of the display area, and the at least one pseudo-touch electrode line is in parallel with the plurality of touch electrode lines.

25. The display panel of claim 19, wherein a number of pseudo-touch lines is less than a number of the plurality of touch lines, and a line width of the at least one pseudo-touch line is thicker than a line width of the plurality of touch lines.

* * * * *